US009771646B2

(12) United States Patent
Neumann et al.

(10) Patent No.: US 9,771,646 B2
(45) Date of Patent: Sep. 26, 2017

(54) LITHIUM SPUTTER TARGETS

(75) Inventors: Martin John Neumann, Memphis, TN (US); Que Anh Song Nguyen, San Jose, CA (US); Disha Mehtani, Mountain View, CA (US); Anshu A. Pradhan, Collierville, TN (US); Robert T. Rozbicki, Germantown, TN (US); Dhairya Shrivastava, Los Altos, CA (US); Trevor Frank, San Jose, CA (US); Todd Martin, Mountain View, CA (US)

(73) Assignee: View, Inc., Milpitas, CA (US)

( * ) Notice: Subject to any disclaimer, the term of this patent is extended or adjusted under 35 U.S.C. 154(b) by 378 days.

(21) Appl. No.: 14/112,909

(22) PCT Filed: Apr. 20, 2012

(86) PCT No.: PCT/US2012/034556
§ 371 (c)(1),
(2), (4) Date: Feb. 5, 2014

(87) PCT Pub. No.: WO2012/145702
PCT Pub. Date: Oct. 26, 2012

(65) Prior Publication Data
US 2014/0138242 A1    May 22, 2014

Related U.S. Application Data

(60) Provisional application No. 61/478,044, filed on Apr. 21, 2011, provisional application No. 61/485,045, filed on May 11, 2011.

(51) Int. Cl.
*C23C 14/34* (2006.01)
*H01J 37/34* (2006.01)

(52) U.S. Cl.
CPC ...... *C23C 14/3407* (2013.01); *C23C 14/3414* (2013.01); *H01J 37/3414* (2013.01); *H01J 37/3426* (2013.01); *H01J 37/3435* (2013.01)

(58) Field of Classification Search
CPC ............. C23C 14/3407; C23C 14/3414; H01J 37/3426; H01J 37/3435
(Continued)

(56) References Cited

U.S. PATENT DOCUMENTS 3,945,911 A    3/1976 McKelvey et al.
4,412,907 A    11/1983 Ito et al.
(Continued)

FOREIGN PATENT DOCUMENTS

CN    1869280 A    11/2006
EP    0984075 A1    3/2000
(Continued)

OTHER PUBLICATIONS

International Preliminary Report on Patentability dated Oct. 31, 2013 issued in PCT/US2012/034556.
(Continued)

*Primary Examiner* — Rodney McDonald
(74) *Attorney, Agent, or Firm* — Weaver Austin Villeneuve & Sampson LLP; Brian D. Griedel (57) ABSTRACT

Described are methods of fabricating lithium sputter targets, lithium sputter targets, associated handling apparatus, and sputter methods including lithium targets. Various embodiments address adhesion of the lithium metal target to a support structure, avoiding and/or removing passivating coatings formed on the lithium target, uniformity of the lithium target as well as efficient cooling of lithium during sputtering. Target configurations used to compensate for non-uniformities in sputter plasma are described. Modular
(Continued)

format lithium tiles and methods of fabrication are described. Rotary lithium sputter targets are also described.

16 Claims, 8 Drawing Sheets (58) Field of Classification Search
USPC ............ 204/298.09, 298.12, 298.13, 298.21, 204/298.22
See application file for complete search history.

(56) References Cited

U.S. PATENT DOCUMENTS

| | | | |
|---|---|---|---|
| 4,904,362 A | 2/1990 | Gaertner et al. | |
| 5,262,032 A * | 11/1993 | Hartig | C23C 14/3407 204/192.12 |
| 5,507,897 A | 4/1996 | Campet et al. | |
| 5,632,869 A * | 5/1997 | Hurwitt | C23C 14/3407 204/192.12 |
| 5,814,195 A | 9/1998 | Lehan et al. | |
| 5,830,336 A * | 11/1998 | Schulz | C23C 14/185 204/192.15 |
| 5,836,506 A * | 11/1998 | Hunt | B23K 20/023 204/298.12 |
| 6,039,850 A | 3/2000 | Schulz | |
| 6,039,855 A * | 3/2000 | Wollenberg | C23C 14/3407 204/298.12 |
| 6,074,279 A | 6/2000 | Yoshimura et al. | |
| 6,270,633 B1 | 8/2001 | Onaka et al. | |
| 6,344,117 B2 * | 2/2002 | Enomoto | C23C 14/35 118/724 |
| 6,582,572 B2 | 6/2003 | McLeod | |
| 6,599,405 B2 * | 7/2003 | Hunt | H01J 37/3491 204/298.12 |
| 6,749,103 B1 | 6/2004 | Ivanov et al. | |
| 7,114,643 B2 | 10/2006 | Ivanov et al. | |
| 7,146,703 B2 | 12/2006 | Ivanov | |
| 7,467,741 B2 | 12/2008 | Wickersham, Jr. et al. | |
| 7,721,939 B2 * | 5/2010 | Facey | B23K 1/0016 204/298.12 |
| 9,334,557 B2 | 5/2016 | Neudecker et al. | |
| 2004/0074770 A1 * | 4/2004 | Wityak | B65G 3/00 204/298.14 |
| 2005/0092604 A1 * | 5/2005 | Ivanov | B21K 25/00 204/298.12 |
| 2006/0266638 A1 | 11/2006 | Hosokawa et al. | |
| 2006/0266639 A1 | 11/2006 | Le et al. | |
| 2006/0272936 A1 | 12/2006 | Yamashita et al. | |
| 2007/0039817 A1 * | 2/2007 | Daniels | B32B 15/012 204/298.12 |
| 2007/0074969 A1 | 4/2007 | Simpson et al. | |
| 2010/0108500 A1 | 5/2010 | Hawrylchak et al. | |
| 2010/0245973 A1 | 9/2010 | Wang et al. | |
| 2011/0005924 A1 | 1/2011 | Schnappenberger et al. | |
| 2011/0031117 A1 | 2/2011 | Kim et al. | |
| 2012/0152727 A1 | 6/2012 | Kwak et al. | |
| 2013/0161188 A1 * | 6/2013 | Linsbod | B21K 25/00 204/298.12 |
| 2014/0318947 A1 | 10/2014 | Parker et al. | |

FOREIGN PATENT DOCUMENTS

| | | | |
|---|---|---|---|
| JP | 62-149866 | * | 7/1987 |
| JP | S62-149866 A | | 7/1987 |
| JP | 63-143258 A | | 6/1988 |
| JP | S63-223168 A | | 9/1988 |
| JP | H04-173966 A | | 6/1992 |
| JP | H06-220628 A | | 8/1994 |
| JP | H07-042582 B2 | | 5/1995 |
| JP | 2003-183822 A | | 7/2003 |
| JP | 2005-113267 | * | 4/2005 |
| JP | 2005-113267 A | | 4/2005 |
| JP | 2008-138225 A | | 6/2008 |
| WO | WO2006/127221 A2 | | 11/2006 |
| WO | WO2012/138498 | | 10/2012 |
| WO | WO 2013/003065 A2 | | 1/2013 |
| WO | WO2015/089533 | | 6/2015 |

OTHER PUBLICATIONS

International Preliminary Report on Patentability dated Jan. 16, 2014 issued in PCT/US2012/042514.
EP Extended Search Report dated Jul. 3, 2014 for EP Application No. 12774507.3.
CN Office Action dated Mar. 23, 2015 for CN Application No. 201280037352.3.
EP Extended Search Report dated Oct. 9, 2014 for EP Application No. 12804836.0.
PCT International Search Report dated Nov. 5, 2012 issued in PCT/US2012/034556.
PCT International Search Report dated Feb. 18, 2013 issued in PCT/US2012/042514.
US Final Office Action dated Jun. 16, 2016 in U.S. Appl. No. 14/129,911.
US Office Action dated Dec. 9, 2016 in U.S. Appl. No. 14/129,911.
EP Office Action dated Mar. 9, 2016 for EP Application No. 12774507.3.
CN Office Action dated Mar. 17, 2016 for CN Application No. 201280037352.3.
CN Decision of Rejection dated Oct. 17, 2016 for CN Application No. 201280037352.3.
US Office Action dated Oct. 26, 2015 in U.S. Appl. No. 14/129,911.
CN Office Action dated Nov. 6, 2015 for CN Application No. 201280037352.3.
EP Office Action dated May 16, 2017 for EP Application No. 12774507.3.

* cited by examiner

LITHIUM SPUTTER TARGETS

CROSS-REFERENCE TO RELATED APPLICATIONS

This is a national stage application under 35 U.S.C. §371 to International Application Number PCT/US2012/034556 (designating the United States), filed on Apr. 20, 2012 and titled "LITHIUM SPUTTER TARGETS," which claims benefit of and priority under 35 U.S.C. §119(e) to U.S. Provisional Application Ser. No. 61/478,044, filed on Apr. 21, 2011 and titled "METHOD OF FABRICATING LITHIUM SPUTTER TARGET," and to U.S. Provisional Application Ser. No. 61/485,045, filed on May 11, 2011 and titled "LITHIUM SPUTTER TARGETS;" all of which are hereby incorporated by reference in their entireties and for all purposes.

FIELD

The present disclosure concerns lithium sputter targets, related apparatus and methods.

BACKGROUND

Although lithium sputter targets and sputtering are known, there is a great deal of improvement needed, particularly in the fabrication methods, configuration and handling of lithium sputter targets. For example, conventional lithium sputter targets have a number of disadvantages. A lithium sputter target typically includes a backing plate or similar support structure due to the malleable nature of lithium metal. That is, the lithium metal needs a support structure to help define the target shape during target formation and also to maintain the lithium's shape during sputtering. Oftentimes the lithium target will heat during sputtering, for example, due to the ion bombardment during sputtering. The lithium may melt and/or may have poor adhesion to the backing plate. Another issue is that lithium metal readily reacts with air, moisture and the atmosphere generally, forming oxides, nitrides, carbonates and the like which passivate the surface of the lithium target. Non-uniformity of depositions using lithium targets is another issue. For example, the morphology of the lithium metal may be different in different areas of the target sputter surface. Attempts to clean the lithium target surface by sputtering off oxide or other passivating coatings may be incomplete in some areas and this non-uniformity is carried through to the lithium deposition to substrate process. Also, due to the shape and/or configuration of conventional lithium sputter targets, variations in plasma density can create non-uniform deposition profiles of the lithium sputtered onto the substrate. What is needed are improved methods of fabricating lithium sputter targets, improved lithium sputter targets and associated methods of sputtering.

SUMMARY

Embodiments described herein include methods of fabricating lithium sputter targets, lithium sputter targets, associated handling apparatus, and sputter methods including lithium targets. Various embodiments address adhesion of the lithium metal target to a support structure, avoiding and/or removing passivating coatings formed on the lithium target and uniformity of the lithium target, for example, morphology, and/or structure of the target to enhance uniformity during lithium sputter deposition. Certain embodiments include target configurations used to compensate for non-uniformities in sputter plasma. Other embodiments include modular format lithium tiles and methods of fabrication. Lithium tiles described herein can be, for example, assembled into a lithium target assembly. Other embodiments include full face lithium targets, that is, lithium targets that are configured so that plasma formed in the sputter chamber is exposed only to lithium of the target; for example, there is no copper or other material, e.g. associated with a backing support, around the perimeter of the lithium metal of the target. In certain embodiments, rotary lithium sputter targets are described. In certain embodiments, efficient cooling of lithium targets is described. These and other embodiments are described in more detail below.

DETAILED DESCRIPTION

A sputter target, in its simplest form, is described herein as an assembly including a backing structure, e.g. a backing plate, backing tube or similar support structure, to which is applied a material to be sputtered, e.g. magnetron sputtering using AC and/or DC current. The backing can be a plate, cylinder, tube or other structure. The focus of this description is lithium sputter targets, although embodiments described herein apply to other soft metals, e.g. sodium, potassium, rubidium, and/or alloys having one or more properties similar to lithium, e.g., sensitivity to moisture and/or air exposure, relatively soft and malleable, and a relatively low melting point. For the purposes of this application, a "soft metal" is a metal or metal alloy having a melting point below 450° C.

Typically, to manufacture a planar lithium sputter target, a lithium ingot is pressed onto a backing plate, e.g., a copper, copper alloy or similar backing plate. A vertical press used to press the lithium into a recess on the backing plate. The recess is used as a form into which the lithium is pressed. Rotary lithium sputter targets may be formed by, e.g. casting, pressing or spraying lithium onto a backing tube, as lithium has a relatively low melting point of about 181° C. and is relatively soft and malleable, even at room temperature.

The description below details various embodiments as they relate to various aspects of lithium sputter targets, e.g., improved methods of handling lithium, applying lithium to backing support structures, improved lithium targets, apparatus for handling and/or processing lithium sputter targets, methods of sputtering lithium and the like. For convenience, the description is segmented into the following sub-sections: Lithium Processing, Contoured Lithium Sputter Targets, Adhesion, Removable Coatings, Non-uniformity, Lithium Tiles, Lithium Tile Planing Apparatus and Full-Face Targets. These headings are provided in no particular order, and a number of inter-related embodiments are discussed in one or more of these sub-sections, therefore the scope of the embodiments is not meant to be limited by these sub-section headings.

Lithium Processing

In various embodiments, rather than using a vertical press to press lithium onto a backing plate, a rolling press is used. A vertical press pushes/moves the lithium onto the backing plate along two dimensions during compression, while a rolling press presses the lithium primarily along a single dimension, which creates a more highly uniform morphology in the lithium. A more uniform morphology translates into more uniform sputter depositions. Also, a rolling press has the advantage that when larger targets are needed, only a single dimension needs to be changed; that is, only a longer roller is needed. In one embodiment, lithium is pressed to a backing plate using a rolling press.

One embodiment is a method of fabricating a lithium sputter target including receiving a metal support structure; and applying lithium to the metal support structure; wherein the lithium is roll pressed to the metal support structure. In one embodiment, the metal support structure comprises copper. In one embodiment, the lithium is pressed at between about 20° C. and about 100° C. In one embodiment the lithium is pressed under inert atmosphere. This is particularly useful at higher temperatures where the pyrophoric nature of lithium is exacerbated.

In one embodiment, the lithium morphology is made more uniform by casting the lithium onto a backing plate as described herein, for example, in a recess of a backing plate. In another embodiment, the lithium is pressed onto a backing plate, for example into a recess, and the backing plate is heated to recast or rework at least a portion of the lithium to further refine its morphology. In certain embodiments, the lithium is heated enough to soften it, make it more amenable to molding, but not liquefy it. This enables molding the lithium on, in and around structures on the backing plate (or cylinder) that otherwise would be damaged or deformed if the lithium were pressed cold. Structures on the backing plate include, without limitation, features for improved adhesion, heat exchange mechanisms (which may also provide adhesion surfaces), recesses and the like.

Contoured Lithium Sputter Targets

In another embodiment, the lithium metal surface and/or the cathode topography is changed to compensate for variations in the plasma density and thereby provide higher uniformity in the sputter deposited lithium. One embodiment is a lithium sputter target having a substantially planar backing plate, but a non-planar lithium target surface. In one embodiment, the lithium target surface varies in planarity, having contours that vary in height between about 1 mm and about 20 mm, in another embodiment between about 1 mm and about 10 mm, in yet another embodiment between about 1 mm and about 5 mm. In one example, a planar cathode is used in combination with a lithium target, where the lithium target surface is not planar in all areas. In this application, the term "target surface" generally refers to the surface of the target that is exposed to plasma; in certain embodiments this may include not only lithium but also backing plate features. In a more limited sense, the target surface is a major surface of the lithium target that is opposing the deposition substrate (typically a glass substrate with one or more deposited layers thereon), although in some embodiments the major surface (face) of the target as well as one or more vertical surfaces of the target may be exposed to plasma (see "full face" targets below). For example where a non-uniformity is observed where sputter deposition is less in amount in the center of the substrate than towards the outer areas of the substrate, the lithium target's topography is configured to accommodate for this non-uniformity in the sputter deposition, for example, the lithium target is higher (the distance between the lithium target and the substrate) in the central regions vs. the outer regions (where the distance between the lithium target and the substrate is larger). In one embodiment, the backing plate is substantially planar (it may have the texturing to improve adhesion as described below) but the lithium on the backing plate has topography that varies from planarity, that is, the side of the lithium adhered to the backing plate conforms to the backing plate while the opposite side, that facing the substrate, is non-planar.

In another embodiment, the backing plate's surface where the lithium target adheres varies from planarity in at least some areas and the lithium may or may not be of uniform thickness (conformal) on the backing plate surface. One embodiment is a lithium sputter target including: i) a backing support having a non-planar topography; and ii) a conformal layer of lithium adhered to the backing support; wherein the non-planar topography comprises contours that vary in height between about 1 mm and about 20 mm. The backing support can be a planar type backing plate or a backing tube. In the latter example, the variation from planarity does not include the curvature of the tube itself, rather the texture of the surface of the tube. One embodiment is a rotary lithium sputter target having variations in topography, i.e. not a smooth curved surface, as described in relation to planar-type sputter targets in the preceding two paragraphs.

Lithium targets having non-planar topography are useful, e.g., for sputtering on a planar substrate in a non-uniform fashion, or, e.g., sputtering onto a non-uniform substrate in a uniform fashion, or sputtering onto a planar substrate in a uniform fashion, e.g. where the sputter plasma has a non-uniform geometry and the contours of the sputter target are configured to compensate for the non-uniformity in the sputter plasma.

Adhesion

Figure 1:
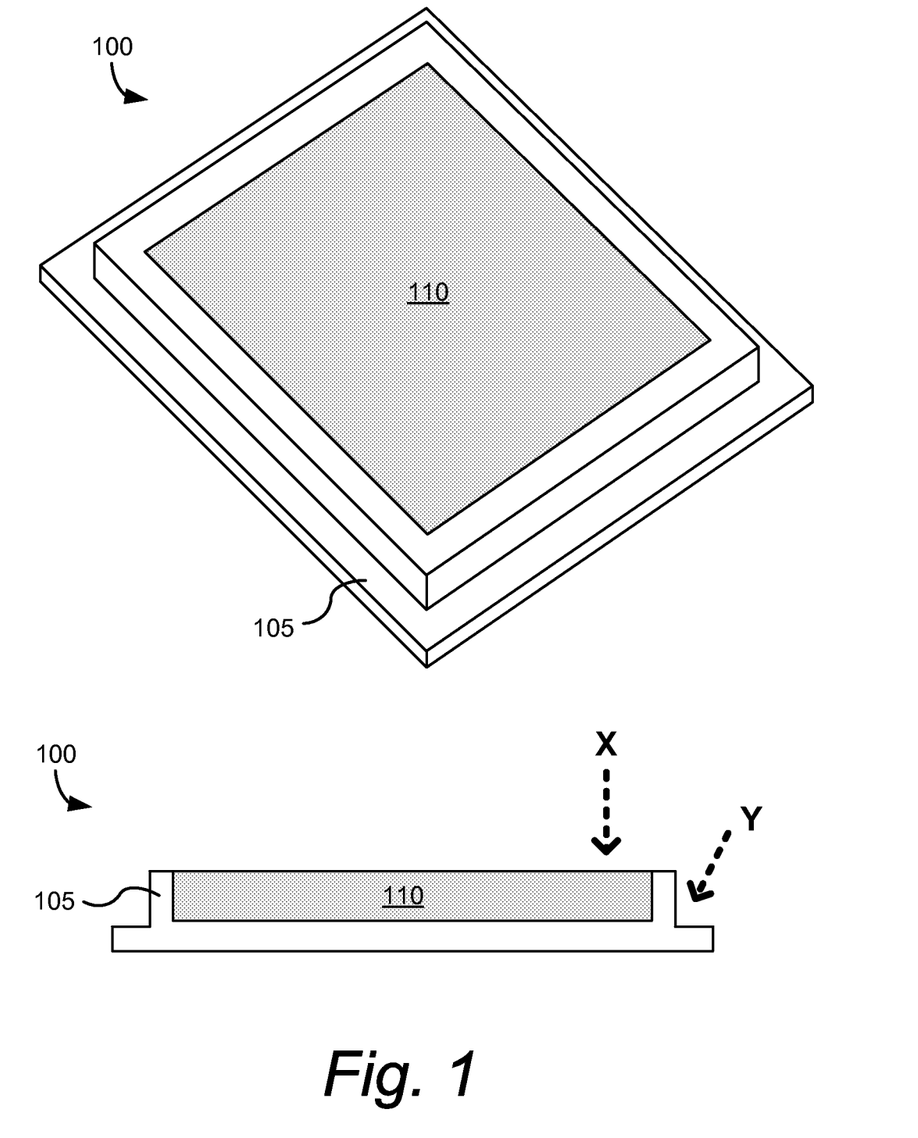
FIG. 1 depicts a perspective and a cross-section of a conventional planar lithium sputter target.

As described above, to manufacture a lithium sputter target, a lithium ingot is pressed onto a backing plate, e.g., a copper, copper alloy or similar backing plate. Conventional commercially available backing plates have a raised perimeter defining a cavity on the plate, and the lithium is pressed into the cavity. This is illustrated in FIG. 1, which shows a lithium sputter target, 100, which includes a copper backing plate, 105, which includes a recessed central portion into which lithium metal, 110, is pressed. The lower portion of FIG. 1 shows a cross-section of target 100, particularly that lithium 110 is pressed into a recessed portion of backing plate 105. As part of the procedure of making the backing plate, particularly the cavity, there are milling or other manufacturing steps that may leave a rough surface in the cavity. Conventionally, these rough features are removed prior to pressing the lithium into the cavity. During sputter, there may be adhesion issues between the lithium and the backing plate.

In certain embodiments, adhesion issues between lithium and an associated backing plate are addressed by increasing the texture and/or topography of the backing plate so that the lithium target adheres more firmly to the backing plate. In one embodiment, the rough features, e.g. occurring as a result of milling a recess, into which lithium is pressed, are not removed prior to pressing the lithium into the cavity. In another embodiment, an existing backing plate is textured, for example, knurled, sanded, ground, sand blasted, treated with a corrosive and the like to add texture for holding the lithium more securely. In these embodiments, the backing plate is physically altered to create a topography on which the lithium can more firmly adhere. One embodiment is a backing plate having such textured features.

In one embodiment, the textured features are not part of the backing plate, but rather added to the backing plate. For example, bolts or studs may be screwed into the backing plate prior to pressing the lithium onto the backing plate. The lithium, due to its ability to deform, is pressed over and around the features of the bolts or studs (e.g. bolts or studs having heads of various shapes, roughness, knurls, ridges, holes, recesses and/or combinations thereof) in order to more firmly hold the lithium to the backing plate. The bolts or studs may be straight, bent at an angle or curved. For example where straight studs are used, e.g. knurled or ridged, the studs are affixed, e.g. via threads or cast into the backing plate, to the backing plate in an orientation such that an axis parallel to their length is substantially perpendicular to a surface of the backing plate that is parallel to the sputter target surface of the lithium. In another embodiment, the studs or bolts are affixed to the sidewalls of the recess into which lithium is to be pressed, alone or in combination with bolts and/or studs affixed to the bottom of the recess.

In one embodiment, a series of textured, e.g., knurled or ridged, rods are mounted in the recess of the backing plate, e.g. parallel to the bottom surface of the backing plate recess and, e.g. across the area of the recess, e.g. affixed in the sidewalls of the recess, so that when the lithium is pressed into the recess, the rods become incorporated in the lithium metal, much like reinforcing rod is used when pouring a concrete sidewalk or slab. The rods may be made of any suitable material. In one embodiment, the rods are made of a metal that aids in conduction of electricity during sputtering. In one embodiment, the rods may be supported by support structures between the bottom of the recess of the backing plate and the rods, so that the lithium doesn't bend the rods significantly so that lithium can't press between the rods and the backing plate recess bottom. In certain embodiments the lithium is cast into the recess. In the latter scenario, supports are not necessary to resist compressive force, but may be used nonetheless, e.g. to prevent molten lithium from deforming the rods during casting.

One embodiment is a lithium sputter target including: i) a backing support having one or more textured features; and ii) lithium pressed, cast and/or sprayed onto the one or more textured features. In other embodiments the lithium is affixed as a pre-shaped body to the backing support. In one embodiment, the backing support is a backing plate or a backing tube and the one or more textured features comprise at least one of knurling, ground or milled features, and an affixed feature. The affixed feature can be a bolt, a stud, a pin or a rod, each optionally including knurling, threads or an uneven surface topography (e.g. waffling, e.g., like reinforcement rod), irregular rough surface, channels, holes, depressions, protrusions, bumps, and the like). In one embodiment, the affixed feature is a heat exchanger. The heat exchanger may include a network of coolant conduits. Heat exchanger embodiments are described in more detail below.

In one embodiment, pipes or conduits are used, with or without rods and/or bolts/studs. The pipes or conduits not only serve as adhesion surfaces and/or electrical conductors as described above, but also can pass circulating coolant for maintaining the temperature of the lithium at an acceptable level during sputtering. Pipes or conduits may serve any combination of these three functions, adhesion surface, electrical conductor, and coolant pathway. When used to circulate coolant, the pipes or conduits are part of a heat exchanger component of a backing structure, such as a plate or tube. The heat exchanger may be in contact with the lithium metal or not, as described in more detail below. By having a heat exchanger very near or in contact with the lithium, more efficient temperature control is achieved, and this opens up process windows for sputtering the lithium. For example, higher powers can be used because the lithium temperature can be more readily controlled, e.g., prevented from overheating.

One of ordinary skill in the art would appreciate that coolant conduits may not be circular pipes, but also could be any shape. For example, the radiator of a car has copper (or other metal) conduits in the form of an open mesh type structure for maximum heat transfer when cool air passes through the mesh. In one embodiment, a matrix of metal conduit, much like in a radiator or other heat exchanger mechanism, is affixed, placed or part of, the recess into which lithium is pressed or cast (or on the surface of a backing structure that does not include a recess). The matrix of metal conduit is on the surface of a backing plate (or cylinder in the case of a rotary target) and the lithium is cast in and around the heat exchanger element. The lithium may also be pressed in and around the heat exchanger mechanism. This structure provides efficient heat transfer, and thus cooling, during sputter deposition, as there are many conduits through which coolant passes during circulation. Conventional sputter targets may have coolant circulation conduits behind the backing plate or inside the backing tube (of a rotary target), but not in direct contact with the lithium metal. Thus embodiments described herein allow sputtering of soft metals, e.g., where issues with hot spots and localized melting during sputter can be an issue.

In various embodiments described herein, the heat exchanger is in direct contact with the lithium metal, e.g. at the bottom of a recess into which the lithium metal is pressed or cast, on the surface of a backing plate or backing tube. Where the lithium metal is cast, the heat exchanger conduit structure need not be particularly structurally strong, so long as it can withstand the temperature needed to cast the molten lithium into the recess and around the heat exchange mechanism (e.g. see FIG. 6B for further description of a heat exchanger within a lithium portion of a lithium target).

One embodiment is a lithium sputter target including: i) a backing support having a heat exchanger on an exterior surface of the backing support; and ii) lithium pressed, cast and/or sprayed onto the heat exchanger. In one embodiment, the lithium is affixed to the heat exchanger as a pre-shaped unitary body. In one embodiment, the backing support is a backing plate or a backing tube. The heat exchanger can include a network of coolant conduits. In certain embodiments, the backing support and the network of coolant conduits both comprise copper. In one embodiment, the lithium is in contact with the network of coolant conduits.

Backing plates configured with the described heat exchangers may be reused by removing the leftover lithium metal, e.g. by liquefying to a molten state and pouring out, and adding fresh lithium metal. In other embodiments, heat exchange elements are inexpensive relative to the finished lithium target and are thus recycled after each use. For example, the backing structure and heat exchanger can be collectively made of copper. The lithium is combined with the backing structure to fabricate a lithium sputter target in a modular format, e.g., including quick release coolant connectors and/or threaded coolant couplings. The lithium sputter target is installed in the sputter coat apparatus, e.g., where the coolant lines are coupled via quick release connectors (e.g. to avoid longer exposure of lithium to ambient prior to pump down). Certain embodiments, described below, include removable coatings to protect the lithium prior to pump down, these would be removed just prior to closing the sputter chamber.

In some embodiments a cover plate is used over the heat exchange network of conduits so that lithium does not come into direct contact with the heat exchange network of conduits. The cover plate forms the base of the recess and may be thin as compared to the thickness of the backing plate so as to convey efficient heat transfer. For example, the cover plate is copper of between 1 mm and about 10 mm thick, although other metals or alloys will work. In certain embodiments, while the cover plate is relatively thin, the conduit network with the cover plate over it can, e.g., withstand the pressure of compressing the lithium ingot into the recess. This is because of the vertical mechanical strength of a heat exchange network of conduits, e.g. the conduit network in a radiator is much like corrugated cardboard, e.g. where the flutes are oriented perpendicular to the plies—this forms a very strong structure which can support significant vertical stress without failure. In another embodiment, the lithium is applied to the recess in a softened or molten form such that this structural strength is not necessary. In one embodiment, a backing plate includes a copper body, a heat exchanger including a network of conduits, e.g. at the base of a recess in the copper body, and optionally a cover plate as described. The cover plate may have texture as described herein to aid in adhesion of the lithium. In one embodiment, the cover plate is not a plate, that is, planar, but rather is shaped to accommodate the various contours of the heat exchanger. These contours aid in heat transfer, but also aid in adhesion of the lithium to the cover plate.

Backing structures described herein are not always flat or planar. A cylindrical backing tube for a rotary lithium sputter target may have any of the textured features described herein, including a heat exchanger on its outer surface, in contact with the lithium or including a cover tube, analogous to the cover plate described herein. This is described in more detail below in relation to rotary lithium sputter targets.

In some embodiments, the backing plate (and/or cover plate as described above) is coated with an adhesion layer to improve adhesion of the lithium. For example, a lithium target backing plate may be made of copper. In one embodiment, the copper backing plate is coated with nickel molybdenum or another material which will have good adhesion to both copper and lithium to improve adhesion of the lithium, when applied as described herein.

As described above, the backing plate may have one or more protrusions that aid in adherence of the lithium to the backing plate. These protrusions may be separate units, e.g. studs, as described above, but also can be part of the backing plate itself. In one embodiment the backing plate has a plurality of pins that extend from the surface of the backing plate on which the lithium resides or will reside, where the pins are milled or cast as part of the manufacture of the backing plate. The lithium is pressed onto the backing plate such that the pins are not exposed at the surface of the lithium that is to be used as a target for the sputtering. Thus, the pins are not exposed to the plasma during sputter. This non-exposure is preferable for any such protrusions, including the above described embodiments having separate structures such as studs, bolts, heat exchanger conduit matrices or other structures which reside in the recess of the backing plate in contact with the lithium. The protrusions which are part of the backing plate metal are not limited to pins, for example, the protrusions may be hooks, loops, open channels, furrows, irregular shapes, and hollow channels with apertures formed therein. In accordance with the above-mentioned embodiments describing studs or bolts, the protrusions that are part of the backing plate may be textured, for example, knurled, sanded, roughened and the like. Also, in addition to, or in the alternative, any type of protrusion described herein may be coated with an adhesion layer as described above.

In various embodiments, lithium is applied to a backing plate via pressing and/or casting and may be reworked thermally to improve adhesion. For example, a backing plate, with lithium pressed thereon, may be heated to improve adhesion of the lithium to the backing plate. The heating may be done before, during and/or after pressing the lithium.

One embodiment is method including creating a textured surface on a backing plate, with or without protrusions as described above, coating with an adhesion layer and pressing and/or casting lithium onto the backing plate. Depending upon the protrusions and/or texture a casting step may be desirable to make sure lithium is fully integrated into depressions, voids or other features of the textured surface of the back plate. The method optionally includes a thermal rework, where, for example, the backing plate is heated to improve adhesion of the lithium to the backing plate and/or adhesion layer on the backing plate.

Any of the embodiments herein may include a backing support including copper, e.g., made of copper or a copper alloy. In these embodiments, the backing support can include an adhesion layer. In certain embodiments, the adhesion layer includes at least one of nickel and molybdenum.

Removable Coatings

Lithium metal is highly reactive, forming oxides, nitrides, carbonates and the like on the surface via reaction with the ambient environment. Conventional handling, although employing some special care, does not address this issue adequately. In one embodiment, lithium is pressed and/or cast onto a backing plate under an inert atmosphere, for example argon. In another embodiment, the lithium target is cleaned by physically removing any passivating coatings prior to installation in a sputter chamber. Physical removal may include, for example, planing off a layer of the lithium of the sputter target to remove any passivating coatings and revealing (fresh unpassivated) lithium metal. In one embodiment, the lithium target is kept under an inert atmosphere continuously during pressing, casting and/or spraying, and/or physical removal of a layer of the lithium.

In one embodiment, a lithium target is manufactured with a non-passivated surface (e.g. the target surface that is sputtered during sputter deposition) and the surface protected with a removable coating. The coating is removed, for example, just prior to installation of the target into the sputter apparatus or after installation, for example, the coating is mechanically removed while in the sputter chamber or removed by sputtering.

In embodiments where the removable coating is to be removed by sputtering, the removable coating is preferably an inorganic material that sputters away easily and minimizes contamination in the sputter chamber. In one embodiment, the inorganic removable coating is substantially gas (such as water vapor) impermeable. In one embodiment, the inorganic removable coating includes at least one of an oxide of aluminum, silicon, zinc or tin. Preferably, the coating sputters off more uniformly than a passivating layer would. The inorganic removable coating may also be covered with an organic removable coating as described in more detail below.

In one example, the removable coating is an organic material, e.g. a polymeric material, for example, teflon, mylar, polypropylene, polyethylene, polyvinylchloride, or similar material. In another example, the removable coating is a diamond-like coating or similar material. In some embodiments, perfluorinated polymers are used, at least as part of, the removable coating. The polymeric coating may be electrostatically applied to the lithium for maximum adherence while allowing easy removal. For example, the lithium sputter target is made under inert atmosphere and/or a fresh surface of the lithium on the target is exposed. The polymeric coating is applied, e.g. via vacuum sealing, electrostatically, or spray or dip coating. The polymeric coating protects the lithium surface from passivation. Just prior to installation of the lithium sputter target, the polymeric coating is peeled off, exposing an unpassivated lithium target surface.

In one embodiment, the removable coating includes one or more compounds, or moieties on the polymer chains, that aid in protecting the lithium surface from oxidation, nitridation, and the like. For example, in one embodiment, the lithium metal surface is treated with a reducing non-aqueous reducing agent and then the polymeric coating is applied to seal the lithium surface and keep the reducing agent in contact with the metal surface. In another embodiment, the polymeric material has reducing groups, and/or oxygen scavenging groups, that protect the lithium metal surface chemically, in addition to the polymeric layer physically blocking, moisture, oxygen and/or nitrogen from reacting with the surface of the lithium. In some embodiments, a reducing agent such as a borane, e.g. borane, diborane, alkyl boranes, lithium ammonia boranes, is part of the removable coating, e.g., as part of the polymer chain or as a monomeric species impregnated in the polymeric removable coating. In certain embodiments, the reducing agent is applied to the substantially non-passivated lithium metal surface prior to application of the removable coating. This forms an extra barrier to oxidation etc. of the lithium target surface.

In one embodiment, the removable coating is a metal coating. In one embodiment, the metal coating is a different metal than lithium. The metal layer can be removed just prior to installation of the target or sputtered off to reveal lithium in situ. In one embodiment, the removable coating is a sacrificial layer of lithium, such as lithium foil. For example, fabrication of the target includes application of a sacrificial layer of lithium. The layer is applied prior to passivation of the lithium target surface. The layer may be applied to the lithium target without significant bonding, or, in one embodiment, bonding around the perimeter so as to seal the layer to the lithium to prevent passivation of the lithium metal of the target from, e.g., gases passing between the layer and the lithium at the edges. When processing under inert atmosphere, the inert gas is trapped between the layer (e.g. foil) and the substantially non-passivated lithium target surface, and thus protects the surface. The sacrificial layer is removed, e.g. peeled off, just prior to installation of the target in the sputter apparatus or after installation (as described above) and, for example evacuation, to prevent target from reacting with atmosphere. The perimeter region where the lithium and sacrificial metal foil were bonded may need to be planed or scraped, but otherwise substantially all of the sputter area of the lithium target is untouched and unpassivated because the sacrificial foil layer absorbed and/or reacted with any moisture, oxygen, nitrogen, carbon dioxide and the like in the ambient and thus prevented exposure of the sputter target lithium surface. In certain embodiments, the metal foil layer is a laminate of lithium foil and another metal, such as aluminum, copper, tin, or an alloy thereof. In one embodiment the foil, as a laminate or not, includes a polymer layer between the foil and the non-passivated lithium target surface. The polymer layer may occupy an area smaller than the entire foil, e.g. inside the pocket formed when the foil is bound to the lithium target surface about a perimeter region, or, e.g. the foil is heated and/or pressed in the perimeter region in order to bind the foil to the lithium surface, displacing the polymer along the perimeter region when the seal is made.

The metal layer embodiments may include a polymeric layer as described herein, over the sacrificial metal layer, with or without a chemical protectant, e.g. a reducing agent, applied to the sacrificial metal layer and/or impregnated in the polymeric coating as described herein. In such instances the polymeric coating need not be removed, but can be, as the metal foil is the removable coating.

One embodiment is a lithium sputter target including: i) a substantially non-passivated target surface; and ii) a removable coating on the substantially non-passivated target surface; wherein the removable coating inhibits the formation of a passivating layer on the substantially non-passivated target surface. In one embodiment, the removable coating is a polymeric material. In one embodiment, the removable coating includes one or more agents that chemically protect the substantially non-passivated surface as well as providing a physical barrier to protect the substantially non-passivated surface. The one or more agents can include a reducing agent, such as a borane as described above. In certain embodiments, whether the polymeric coating contains a chemical protectant or not, the substantially non-passivated target surface includes a reducing agent that is applied to prior to the removable coating. In one embodiment, the removable coating is a metal foil, such as lithium foil. As described above, in certain embodiments, the lithium foil is bonded to the substantially non-passivated target surface only around a perimeter region. An inert gas can occupy the space between the lithium foil and the substantially non-passivated target surface.

Non-Uniformity

Non-Uniformity in sputter deposited lithium can arise in many ways. For example, a lithium target typically includes a flat surface of the lithium after pressing onto a backing plate. Non-uniformities in the sputter deposited lithium using such targets can be due to the topography of the backing plate. This is explained in more detail with reference to FIG. 1. For example, conventional backing plate 105 has a raised perimeter defining a cavity on the plate, and lithium 110 is pressed into the cavity. Referring to the cross-section of FIG. 1, although the sputter plasma in area X may be uniform, parasitic plasma densities can form around the raised perimeter sidewalls having corners or other features, see area Y, and therefore sputter the backing plate material, for example copper, along with the lithium. In one embodiment, instead of a raised perimeter on a backing plate, a recess is, for example milled, out of a backing plate and the lithium pressed into the recess. This is described in relation to FIG. 2A, which depicts a perspective and a cross section of an assembly, 200, including a copper backing plate, 205, with lithium, 210, pressed into a recess in the backing plate. Backing plate 205 does not have featured outer sidewalls as depicted in FIG. 1, which can promote parasitic plasma densities as described. There are no raised areas of the backing plate where parasitic plasmas can form and cause co-sputter of the backing plate material. The lithium and copper surface are substantially co-planar across the sputter surface.

In some embodiments, the copper or other material of the backing plate, particularly that which is exposed to the plasma during sputter, is passivated so that it does not sputter with the lithium.

In one embodiment, the lithium target area is maximized with respect to the backing plate area to avoid interaction of the plasma with the back plate material. FIG. 2B depicts cross-sections of assemblies having backing plates, 205a, 205b and 205c. These backing plates are configured to maximize the ratio of lithium to backing plate area on the target sputter surface. For example, as depicted in FIG. 2B, there is only a thin perimeter of backing plate material, e.g. copper, on the target surface area. The width of this perimeter region of backing plate material will depend on, e.g., the amount of lithium pressed into the recess and/or acceptable levels of copper that may be exposed to the sputter plasma. Also, although there are sidewalls, in this example copper sidewalls, the sidewalls have no features, but rather are single surfaces, e.g.

curved convex, curved concave, flat vertical or angled, respectively, that minimize parasitic plasma formation. One embodiment is a sputter target backing plate including: i) a unitary body comprising copper; and ii) a recess in the unitary body; where the recess comprises exterior sidewalls having a single surface and wherein the surface area of the top of the sidewalls comprises between about 1% and about 20% of the area of the opening of the recess. In another embodiment, the surface area of the top of the sidewalls comprises between about 1% and about 10% of the area of the opening of the recess, in another embodiment between about 1% and about 5% of the area of the opening of the recess. In certain embodiments, the single surface is substantially planar and vertical or angled; in other embodiments, the single surface is curved convex or concave.

Lithium Tiles

In certain embodiments, existing methodology is used to fabricate smaller lithium targets that are configured into a larger target assembly. For the purposes of this description these are referred to as "lithium tiles." In these embodiments, conventional (or not) lithium target fabrication and press capabilities are leveraged in order to create lithium tiles. Lithium target fabrication requires high pressure to form an acceptable bond with the backing plate. Larger than conventional lithium targets are needed for large area substrates, for example, architectural scale windows having, e.g., electrochromic devices thereon which require lithium. However, scaling lithium pressing to larger sizes would require significantly higher press capabilities. Also, when lithium must be pressed to cover larger and larger areas, the morphology of the lithium metal is harder to control from one area to another of the total area. In order to address at least these issues, lithium tiles are fabricated and configured such that they are modular and can be configured to form a larger target assembly which is used for the sputtering process. A lithium tile includes lithium target metal and a backing plate, where the lithium tile is configured for assembly with one or more additional lithium tiles.

In certain embodiments, a lithium tile has a rectangular area, and is between about 6 inches and about 36 inches on any side, in another embodiment between about 6 inches and about 24 inches on any side, in another embodiment between about 10 inches and about 24 inches on any side. In one embodiment, the lithium portion of the tiles may be between about 1 mm and about 100 mm thick (deep), that is, the portion of lithium in the direction of erosion by the sputter gas or plasma.

Using lithium tiles allows for improved local morphology control. For example, lithium tiles, because their size is smaller and thus pressing and working the lithium of each tile is more controllable, allow for formation of the same, or different, grain structure morphology, e.g. along length of the assembled target, which in turn allows more control in sputter plasma uniformity profiles. Also, because lithium metal has low yield strength, lithium tiles can be, for example, arranged on a cathode assembly to form a target assembly, and the lithium of the target assembly then pressed in-situ on the target assembly to allow the lithium of abutting tiles to fuse together to form a single lithium metal portion of the target assembly.

Figure 3A:
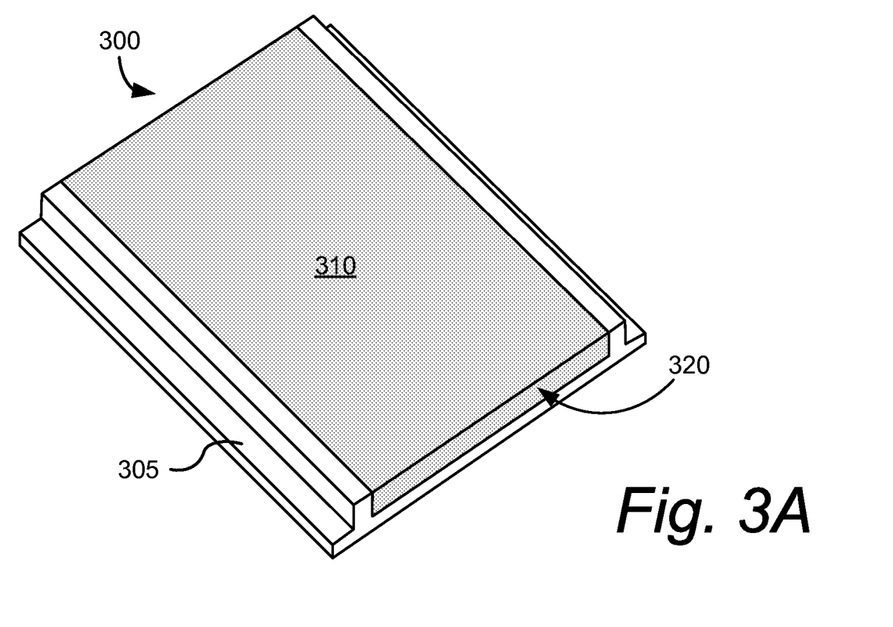
FIG. 3A is a perspective of a lithium sputter target tile having two sides with exposed lithium.
Figure 3B:
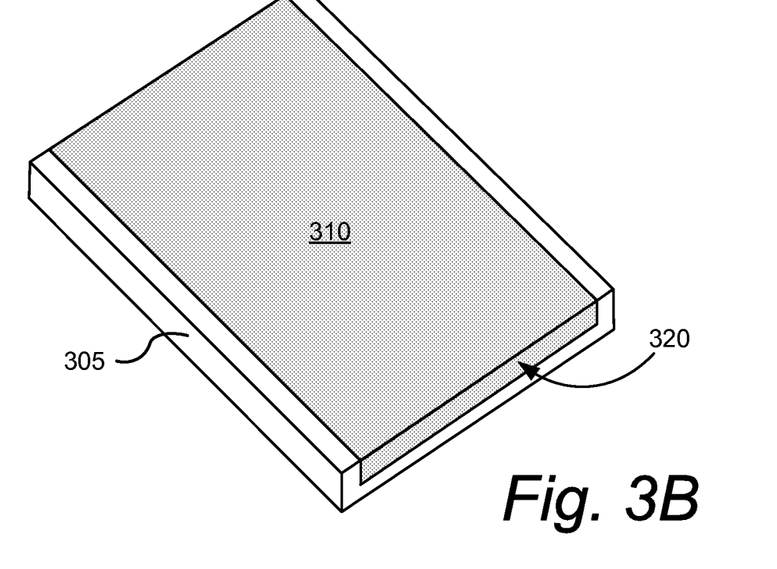
FIG. 3B is a perspective of a lithium sputter target tile having two sides with exposed lithium.

One embodiment is described in relation to FIGS. 3A and 3B. Referring to FIG. 3A, lithium, 310, is pressed into a backing plate, 305, for example copper with a machined out "trench" having side walls but open on the ends as depicted. Together, a lithium tile, 300, is fabricated. In one embodiment, during fabrication of a lithium tile, temporary side walls are applied at both ends of the copper backing plate, so that lithium is held from extruding out the ends, 320, of the channel in the backing plate. These side walls act as part of a mold structure, which includes the side walls of the trench. The temporary side walls are kept in place during fabrication, for example when lithium is pressed and/or cast into the mold structure. When the temporary sidewalls are removed, the lithium tile as depicted results, where lithium is exposed at each end of the lithium tile (see 320). It is these exposed ends of the lithium metal that, when abutted to each other and the tiles pressed after fabrication into a target assembly on a cathode as described above, can be fused together so that there is a single lithium metal portion of the target assembly. In one embodiment, the temporary side walls are kept in place during storage and shipment of the lithium tiles, and only removed during installation of the lithium tile in a target assembly. In one embodiment, the side wall supports are made of a material that doesn't react with lithium, doesn't adhere to lithium to any appreciable extent and prevents or suppresses lithium oxidation, nitridation and/or carbonate formation. In certain embodiments, the materials described in relation to the sacrificial coating for lithium targets may be used in combination with the support sidewalls. In certain embodiments, a lithium tile form, e.g. like tile 300 depicted in FIG. 3A, is formed as a long tile. For ease in shipment and handling, the longer tile is cross cut into shorter tiles.

FIG. 3A shows a lithium tile that has features that allow clamping the tile as part of a cathode assembly. As depicted in FIG. 3B, these features may not be necessary, as the tiles may be affixed to a cathode via the rear face of the tile or by other affixing mechanisms. Thus, these tiles do not have features that allow parasitic plasmas to form (i.e. they include features as described in relation to tiles in FIGS. 2A and 2B).

Figure 4A:
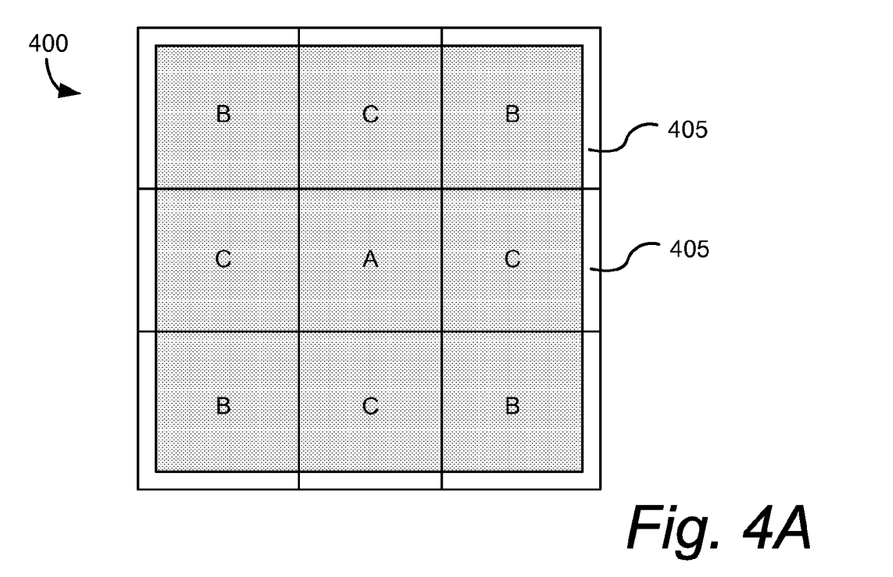
FIG. 4A is a front view of a lithium sputter target assembly of lithium tiles having three different configurations.

In one embodiment, temporary side walls are used along all four sides so that a temporary mold or volume is created in which the backing plate serves as the bottom of the volume. Lithium is pressed or cast to fill the volume. The temporary side walls are removed prior to assembly of a target assembly. Thus the lithium tiles formed by this method have lithium metal exposed on the target face (that is exposed to plasma once the tiles are assembled into a target assembly), and on all four sides where the temporary side walls formed the mold. In this embodiment, some lithium tiles may be abutted on all four sides by other lithium tiles. In one embodiment, a temporary side wall as described above is used on one or more sides. For example, it may be desirable to form a target assembly where the lithium tiles on the perimeter of the target assembly are bordered with copper side walls (405). For example, as depicted in FIG. 4A, if a target assembly uses nine lithium tiles arranged in a 3×3 matrix, assembly 400, then the center tile, A, will have lithium on a copper backing plate, but no copper side walls. That is, the lithium in center tile A is exposed on all four sides as described above when four temporary side walls are used during fabrication. Lithium tiles, B, on the four corners of the target assembly will have backing plates with two copper sidewalls that adjoin at a right angle, and two sides where lithium is exposed at the other corner of the tile, each of these sides abuts other lithium sides of tiles, C, in the target assembly. Lithium tiles C have lithium on the sidewalls of three sides, and copper on one side.

Figure 4B:
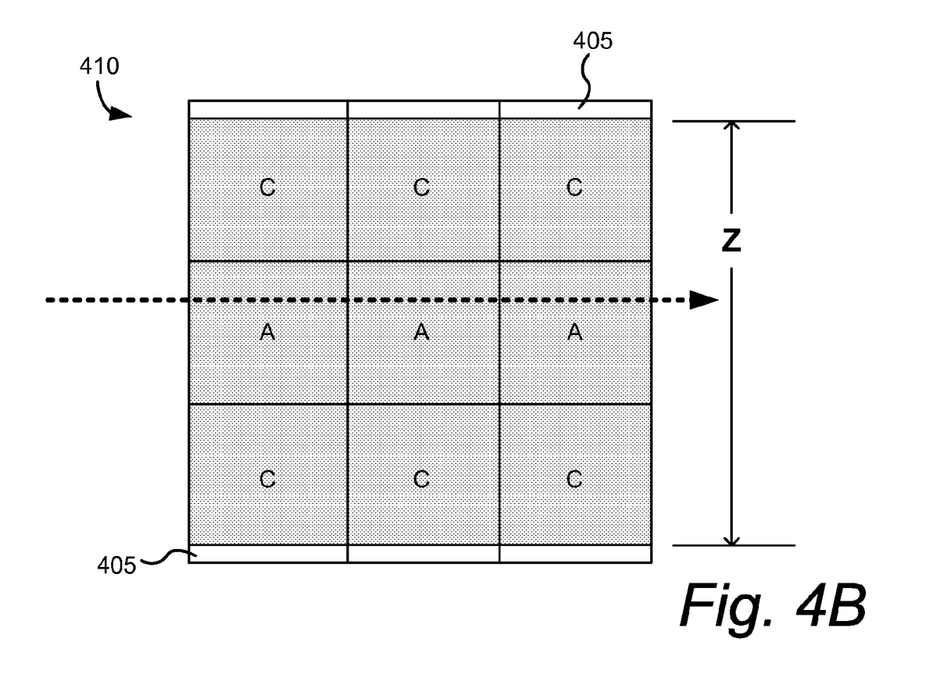
FIG. 4B is a front view of a lithium sputter target assembly of lithium tiles having two configurations, where the assembly has two sides of exposed lithium.

In certain embodiments, a target assembly, 410, is comprised of two types of lithium tiles, type A and type C. In this example, target assembly 410 has copper sidewalls, 405, on two opposing sides and lithium sidewalls on opposing sides. As described above, it may be inconvenient to construct a large unitary lithium tile, so in this embodiment, a large assembly of lithium tiles is formed to provide a construct that, e.g., is used to pass a large area substrate past during sputter, where the substrate "sees" only lithium during traversal past the lithium tile target assembly 410. That is, if the substrate is translated past the target assembly, as indicated by the dotted arrow, the substrate's height is not greater than the combined height, Z, of the tiles, and the substrate is centered with assembly 410 during translation, then the plasma of lithium can be formed sufficient to span the height of the substrate but no more. In this way, the substrate it exposed only to lithium during sputter deposition, even though the target assembly has two opposing sidewalls of, e.g., copper. In other words, only the central region of the tile assembly is used during sputter. Other ways to ensure this result are described below.

Figure 5A:
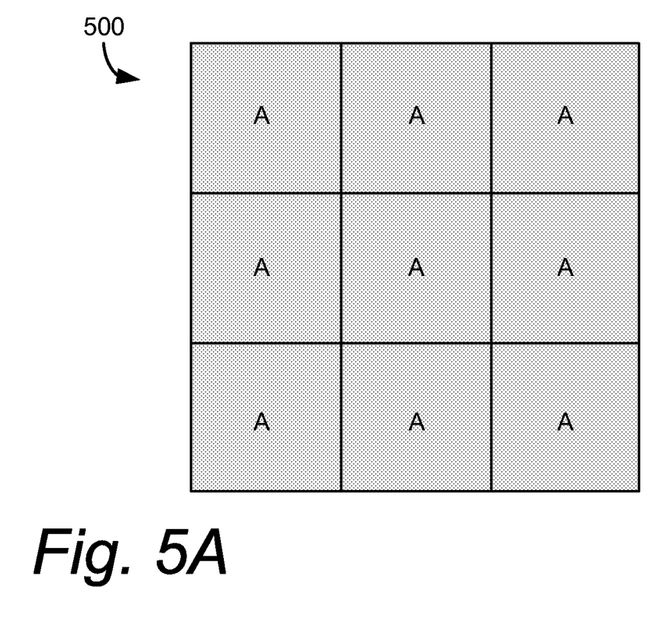
FIG. 5A is a front view of a lithium sputter target assembly of lithium tiles, where the assembly has four sides of exposed lithium.
Figure 5B:
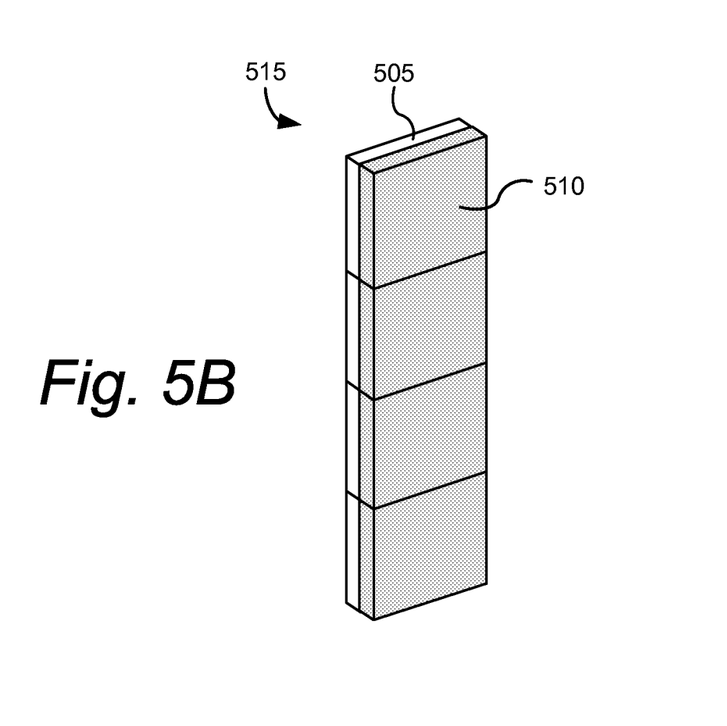
FIG. 5B is a perspective of a lithium sputter target assembly of lithium tiles including a backing plate, where the assembly has four sides of exposed lithium.

In one embodiment, two or more lithium tiles, as represented by type A, having lithium on the target surface as well as on all four side walls, are used to fabricate a target assembly, that is, an assembly where there is neither copper exposed on the target face (where the sputtering takes place) nor on the four sides of the target around the perimeter. This is depicted in FIGS. 5A and 5B, for example a 3×3 matrix, 500, of lithium tiles A, (target face view) or for example a linear arrangement, 515, of lithium tiles, in this example, arranged vertically, each affixed to a copper backing plate, 505 (depicted in perspective showing that the lithium face and sides are exposed. The target assemblies in FIGS. 5A and 5B are examples of a planar sputtering target which has lithium on all exposed surfaces except the surface (bonded to backing plate) which faces the cathode, herein termed a "full-face" target. Full-face targets are described further below.

Lithium tiles and the target assemblies fabricated from the tiles as described have a number of advantages. For example, since lithium is a hazardous material, storing and transporting smaller lithium tiles for eventual configuration into a larger target assembly is significantly safer. Lithium targets suffer from target quality issues, for example localized non-uniformities, gas bubbles, inclusions, poor adhesion to the backing structure and the like. By using modular lithium tiles, a user may reject bad tiles during fabrication of the target assembly instead having to reject a large single target. Likewise, depending upon the uniformity of the plasma sputter, some tiles will be used up before others and can be replaced without replacing all of the tiles in the assembly. This significantly increases target yield and saves time and resources. Also, since target characterization often requires inert environments, it is much easier to characterize smaller lithium tiles than to design and build a large controlled ambient, for example a large glove box and load lock. Additionally, since the tiles can be fabricated in smaller sizes, protective coatings as described above in the "Removable Coatings" section are more easily applied and removed, for example, at the installation site. In one example the tiles are manufactured, a removable coating is applied, and the tiles are stored and/or shipped with the removable coating.

One embodiment is a target assembly for sputtering a soft metal, the target assembly including a plurality of modular tiles, each tile of the plurality of modular tiles including a backing plate and the soft metal. In one embodiment, the soft metal is lithium. The backing plate can include copper or other metal or alloy. In one embodiment, each of the plurality of modular tiles includes at least one side where the lithium is exposed. In one embodiment, each of the plurality of modular tiles includes lithium adhered to the backing plate such that the lithium is exposed on all sides except at the interface between the backing plate and the lithium.

One embodiment is a modular format sputter target tile including: i) a backing plate; ii) a soft metal adhered to the backing plate; and iii) a removable protective coating at least on the target surface of the soft metal. In one embodiment, the backing plate includes copper, the soft metal is lithium and the removable protective coating includes a polymer.

As described in the "Lithium Processing" section above, in certain embodiments, the target surface of the lithium target, or collectively the tiles making up the target assembly, is contoured to compensate for variations in plasma density and/or other issues with non-uniformity. In certain embodiments, rather than, or in addition to, changing the planarity of the target surface, in one embodiment, individual lithium tiles making up an assembly are movable in a direct perpendicular to the target surface. In some embodiments, the individual tiles are moved during sputter to accommodate for variations in the plasma that would otherwise occur, e.g., as a result of irregularities in the magnetic field, electrical source, etc. The individual tiles may be moved fast or slowly, depending on the desired result. Thus, for example, during sputter certain individual tiles may have more lithium removed than other tiles. These tiles can be moved toward the substrate so their surfaces again are substantially in the same plane as those tiles whose target surfaces have not eroded as much from the sputtering. In some embodiments, the tiles would be moved so that a substantially planar target surface (collectively across the target assembly) is achieved during the sputter process, in order to achieve uniformity in the sputter deposition. In other embodiments, the tiles are purposely positioned so that the collective target surface is contoured in order to achieve a desired deposition profile across a substrate, e.g., a uniform conformal deposition, or a deposition that is non-uniform, according to some desired parameters. In embodiments with movable tiles, bonding of the sidewalls of individual tiles to each other is to be avoided so that the tiles can move independently of one another.

Lithium Tile Planing Apparatus

Figure 2A:
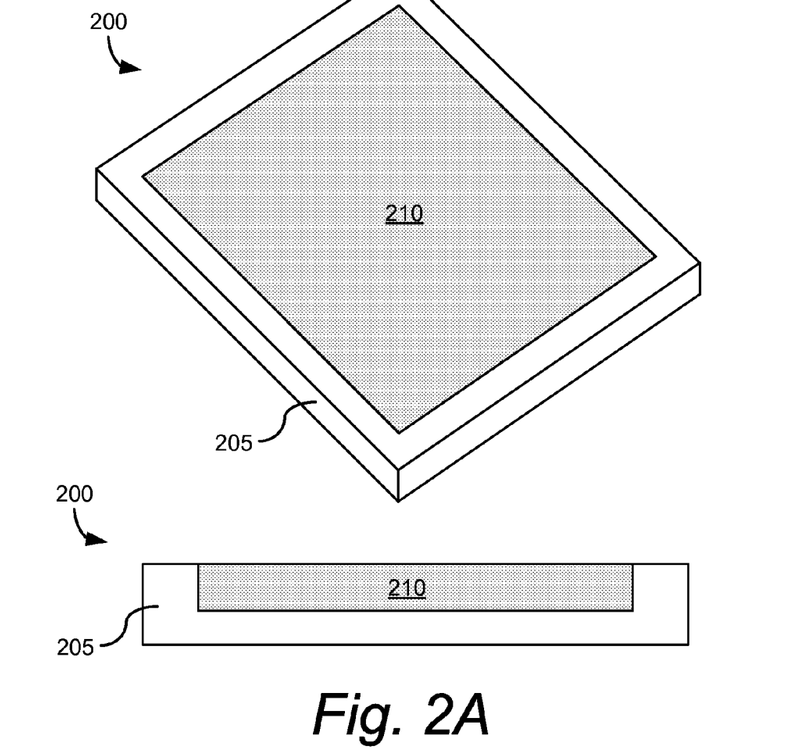
FIG. 2A depicts a perspective and a cross-section of a lithium sputter target.
Figure 2B:
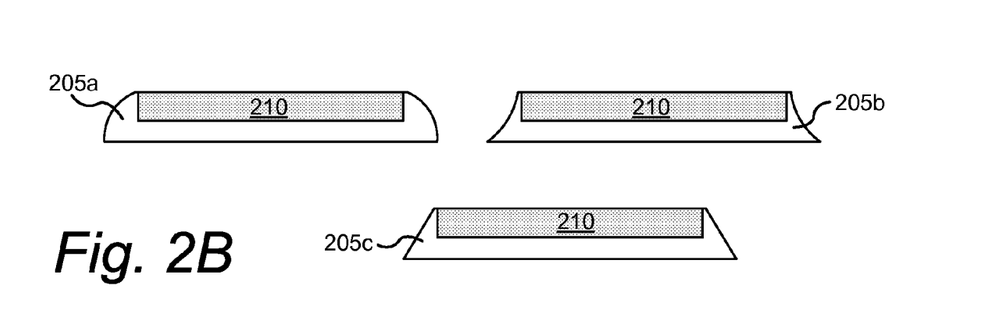
FIG. 2B depicts cross-sections of lithium sputter targets.

Since the tiles are smaller and easier to handle, and in some embodiments substantially the same, for example tiles such as described in relation to FIGS. 2A through 5B, they can be further processed at the site of installation, and/or, e.g., prior to shipment. In one embodiment, the tiles are further machined at the site of installation prior to installation as a target assembly. One embodiment is a planing apparatus used to plane one or more layers of lithium from the lithium tile. In one embodiment, the apparatus is portable. In one embodiment, the lithium tile is manufactured such that there is extra lithium on the target surface such that the target surface is planed by the planing apparatus at the installation site prior to assembly of the tiles. In one embodiment the planing apparatus has the capability of planing copper as well as lithium such that, for example as depicted in FIGS. 2A and 2B, both lithium and copper can be planed from the tile to achieve a substantially planar face of the lithium target. The lithium tiles may be passed through the planing apparatus one or more times prior to installation. The planing apparatus can plane as little as a fraction of 1 mm up to several millimeters of metal off the tile in a single pass. In one embodiment, the planing apparatus can plane between about 0.1 mm and about 10 mm of metal in a single pass, in another embodiment, between about 0.1 mm and about 1 mm in a single pass. After planing sufficiently, a fresh, unpassivated, surface of lithium is exposed. In certain embodiments, the planing apparatus is specifically configured to plane only the lithium of a tile, while not planing the copper or other backing plate material.

In one embodiment, the planing apparatus includes an inert gas inlet for applying inert gas to the freshly exposed metal surface of the lithium tile. The apparatus can include a lithium metal collection bin, which may also include inert gas atmosphere protection. In one embodiment, the collection bin can be removed, emptied and reinstalled (or a replacement installed) while a positive pressure of inert gas passes out of the aperture at the bin attachment area and/or there is a retractable cover that covers the aperture where lithium enters the bin (for example a gravity feed where the planed lithium drops into a bin below the planing device) whenever the bin is removed from the planing device (for example, like a spring loaded door over a video tape port of a video tape machine). The bin may also have a retractable cover that engages when the bin is removed, for example detached, from the planing apparatus.

In one embodiment, the planing apparatus includes a receiving bin, the receiving bin including an inert atmosphere chamber where one or more tiles are received after exiting the planing mechanism of the apparatus. In one embodiment, the inert atmosphere environment is maintained during planing and tile entry into the receiving bin and while tiles reside in the receiving bin. In one embodiment, the receiving bin includes a receiving tray for organizing the freshly planed tiles. The receiving bin may include a load lock or inert atmosphere positive pressure, so that the tiles may be removed from the bin while not compromising the inert atmosphere of the receiving bin. In one embodiment, the load lock has inert atmosphere sweep capability and/or one or more vacuum inlets so that air can be swept out and/or evacuated after each exposure during tile removal from the load lock. The tiles may be inspected visually prior to installation in a target assembly and/or, in one embodiment, the planing apparatus includes a surface analysis module, for example an optical scanner, for determining the surface quality of the individual tiles after they exit the planing apparatus. The planing apparatus may include a sorter that separates tiles of acceptable surface quality from those without such quality.

One embodiment is a planing apparatus for removing a layer from a sputter target comprising a backing plate and a soft metal thereon, the planing apparatus including: i) a planing mechanism; ii) an inert gas supply; and iii) a collection bin for the material planed from the sputter target; where the planing apparatus is configured such that the planing operation and collection bin are protected by inert atmosphere during operation. In one embodiment, the planing apparatus further includes a receiving bin, configured to receive the planed sputter target under inert atmosphere. Further, the receiving bin can include a load lock or inert atmosphere positive pressure, configured so that the tiles may be removed from the receiving bin while not compromising the inert atmosphere of the receiving bin.

Full-Face Targets

In one embodiment, a bonded planar sputtering target has only lithium exposed at the target surface, e.g., a lithium target may have only lithium exposed on five sides: the target surface and the four sides. The back side surface, facing the cathode body, is held to the cathode body by features which are unique to this surface (see e.g. adhesion above). This configuration exposes only lithium target material to the plasma environment to provide high purity mass transfer within the plasma eliminating undesirable foreign contaminants from the plasma. As described above, when the four sides of each tile are lithium, abutting tiles may be pressed together during assembly so that there is a continuous lithium target surface.

Such targets may be formed, e.g., by having four walls converge (e.g. driven by hydraulic cylinders) on a backing plate so that they form a recess on the backing plate. Lithium is pressed into the recess. Then the four walls are removed so that the lithium pressed into the recess, using the backing plate as the bottom of the recess, will be raised relative to the backing plate. In other words a "block" of lithium is formed on the backing plate, adhering to the backing plate only by the back side of the lithium block. The block of lithium may be adhered to the backing plate as described herein, e.g., using protrusions and the like on the backing plate.

In conventional lithium sputter targets, lithium is bonded to a backing plate and the backing plate is secured to the cathode body with clamps and bolts and/or screws on the target side. Typically the backing plate, clamps and fasteners are made of material that differ from the desired target material intended to be sputtered. This exposed hardware is inadvertently eroded by plasma and the constituents are consequently included with the target materials within the plasma. These undesired materials contaminate and compromise the purity of the desired deposition material. By encapsulating a backing plate on exposed surfaces with the target metal, for example lithium, and securing the target to the cathode from the cathode side, only the target material is exposed to plasma and therefore only target material will be sputtered. This configuration eliminates the possibility of contaminating the plasma with foreign materials, thus improving sputtered film quality and process control. Also, backing plate manufacturing is less complicated, and the number of components required to attach the target to the planar cathode is reduced, and therefore maintenance is also reduced.

Figure 6A:
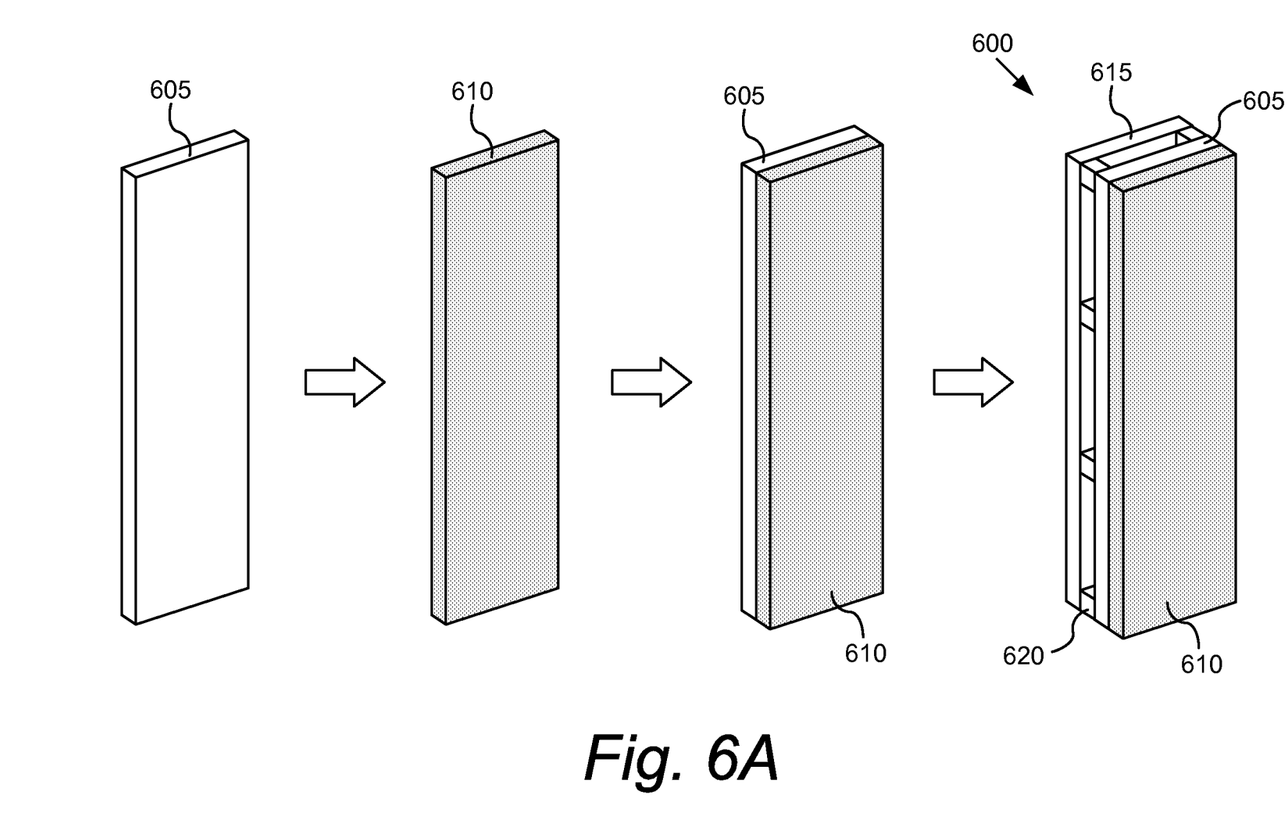
FIG. 6A depicts a lithium sputter target assembly of a full face target on a cathode.

FIG. 6A depicts an exemplary assembly, 600, of a full face target on a cathode. Assembly 600 includes a back plate, 605, onto which is bonded a lithium metal portion, 610. Lithium metal portion 610 is adhered to backing plate 605 as described herein. The backing plate and lithium metal portion thereon make up the full face target. The full face target is attached to a cathode, 615, via the back plate 605, via supports, 620. Supports 620 may also serve as insulators to electrically isolate the cathode body from the sputter chamber. In one embodiment, the backing plate has a series of contact pins or studs (not depicted) made of an electrically conducting material such as stainless steel or titanium. The contact pins are configured so as to mate with sockets in the cathode body so as to supply a negative electrical charge to the full face target (via the backing plate). The contact pins can also serve as structural supports for the full face target. Typically the cathode and/or backing plate are water cooled to avoid excessive heat buildup (cooling lines not depicted).

As described above, in certain embodiments, a heat exchanger is configured on a backing plate and lithium is formed, e.g. cast, on and around the heat exchanger so that the lithium can be efficiently cooled during sputter deposition. One such embodiment is described in relation to FIG. 6B. A backing plate, 625, includes a heat exchanger, 630, which in this example is a network of conduits through which coolant is passed during sputter. In this example, heat exchanger 630 is on the surface of backing plate 630; supports, 626, which may also be coolant inlets and outlets, support the conduit matrix of heat exchanger 630. For example, backing plate 625 and heat exchanger 630 (and supports 626) may all be made of copper, or individually copper, copper alloy or other metal or alloy.

Figure 6B:
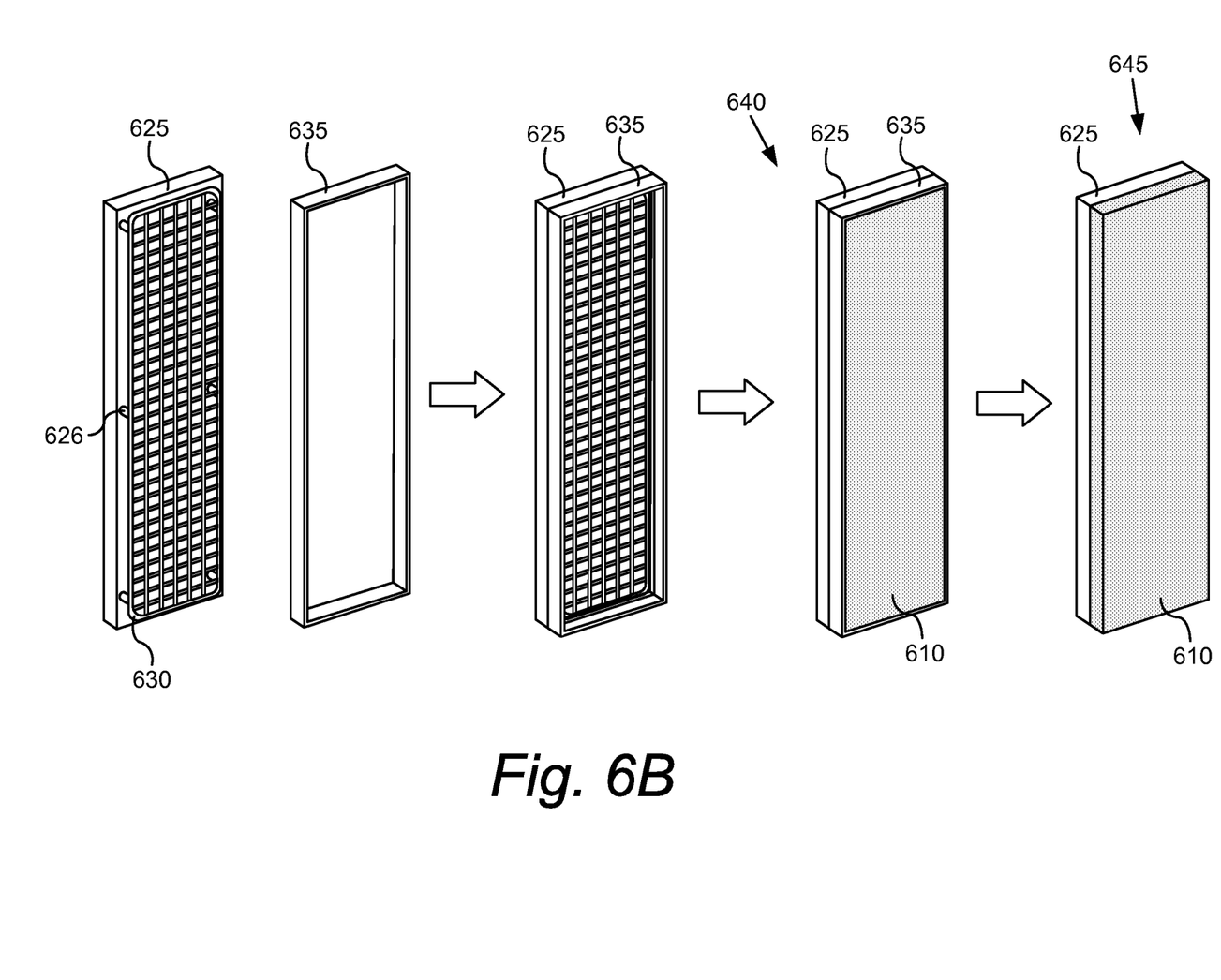
FIG. 6B depicts a lithium sputter target assembly including a heat exchanger within a lithium portion of a lithium target

In order to fabricate a lithium target, a frame, 635, or similar structure (e.g. four walls, each) is configured about the perimeter of heat exchanger 630, and associated with the backing plate such that lithium can be introduced, e.g. cast or pressed, into the recess formed by association of the frame with the backing plate. In this example, some space is allowed between the heat exchanger and the interior surfaces of frame 635. Lithium, 610, is introduced into the recess to form assembly 640. In one embodiment the lithium is poured into the recess in molten form and cast. In another embodiment, lithium is pressed into the recess, either cold or in a heated and thus softened form. The lithium surrounds the heat exchanger conduits and structure. Sufficient lithium is applied such that there is a thickness of lithium on the sputter surface as desired for sputtering. Frame 635 is removed to reveal the sidewalls of a lithium portion of a lithium sputter target, 645. In certain embodiments the recess is part of the backing plate, such that a frame is not necessary; that is, the final lithium target resembles assembly 640. Lithium sputter targets described herein may have one or more open sides to the lithium portion (e.g. as described in relation to lithium tiles). As described above, having a heat exchanger in contact with the lithium of a lithium sputter target allows for efficient cooling of the lithium during sputtering.

Figure 7:
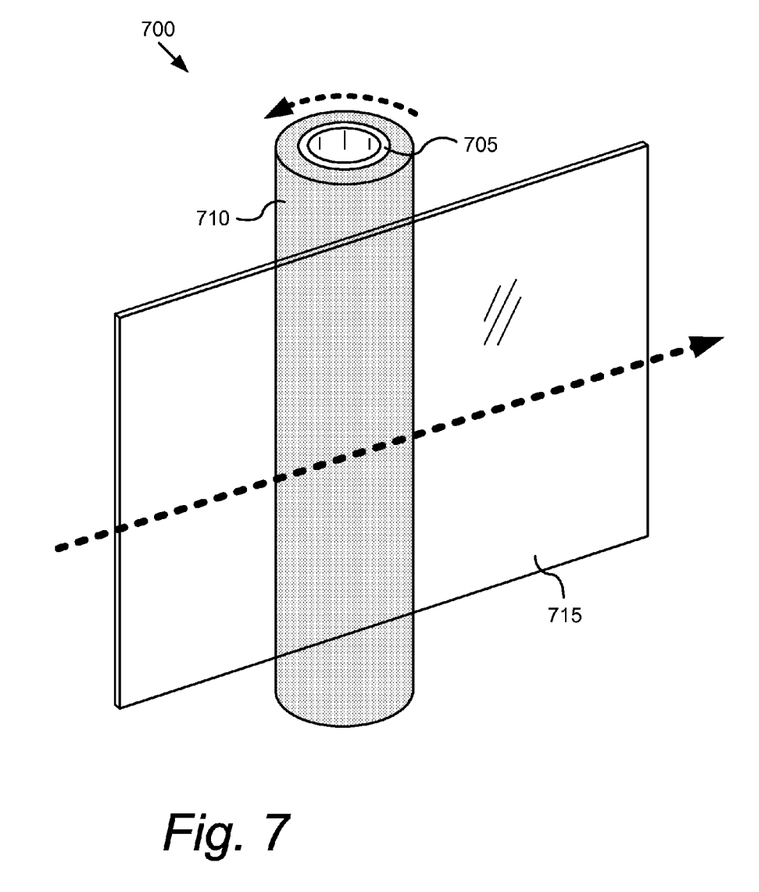
FIG. 7 is a perspective of a rotary lithium sputter target.

One embodiment is a rotary lithium target. The rotary target may have some backing support material exposed or be a full-face target. Rotary lithium targets are particularly useful for addressing non-uniformity issues that may arise with planar sputter targets. FIG. 7 shows an example of a rotary lithium sputter target, 700. Target 700 includes a backing tube, 705, onto which is applied a lithium portion, 710. The lithium may be pressed, sprayed or cast onto the backing tube. During sputter, target 700 is rotated as a substrate, e.g. a glass sheet 715, is translated past the target. In FIG. 7, for simplicity, no magnets, electrical connections or other components are depicted. One of ordinary skill in the art would appreciate that rotary lithium sputter targets described herein can be installed in a sputter coater as other rotary targets, e.g. ceramic targets, with appropriate electrical and other connections and mechanical components to rotate and support the target.

Lithium has a low melting point (~181° C.) and has a low thermal conductivity. As described above, when sputtering lithium the lithium may heat to melting, which destroys the target surface and creates sputter non-uniformities. Conventional backing plates or tubes have coolant circulation behind the backing plate or within the tube structure (behind the surface to which the lithium is adhered); conventional backing supports do not have cooling conduits on the surface where the lithium or other soft metal is adhered and therefore within the lithium so applied. The heat exchanger embodiments described above may also be applied to rotary lithium targets. For example, a cylindrical backing tube having a heat exchange conduit matrix thereon is positioned in a cylindrical mold. Molten lithium is poured into the mold and, after casting, the mold is removed to reveal a rotary lithium target analogous to target 645, that is, where a heat exchanger is buried inside the lithium metal for more efficient cooling during sputter deposition. Appropriate rotary unions and the like are used to connect the heat exchanger to coolant feed and outlet lines. In other embodiments, the lithium is spray coated onto the heat exchanger until the heat exchanger is coated with lithium and forms a smooth surface of lithium without any heat exchanger components exposed on the sputter target surface (the area to be sputtered). In other embodiments, the backing support is dipped into molten lithium or other soft metal one or more times until the desired thickness of metal is coated on the backing support. This latter method may have the advantage of forming laminated layers of the sputter metal. Depending on the thickness of the target metal desired, the spraying or dipping methods can be continued, or not, until the desired thickness is reached.

In certain embodiments, the heat exchanger network of cooling conduits are relatively shallow, so that the amount of lithium or other soft metal that needs to be added to cover the conduits is minimized. In one embodiment, the cooling conduits extend between about 1 mm and about 20 mm from the surface of the backing support, in another embodiment between about 1 mm and about 10 mm from the surface of the backing support. The lithium or other soft metal need not cover the entire coolant conduit network, e.g., the rotary sputter target may be sufficiently long so that the actual portion of soft metal that is sputtered resides on a central portion of the target while, e.g., one or both distal ends of the target have exposed heat exchanger components. In one embodiment the soft metal covers at least about 90% of the length of the rotary sputter target.

For coating large area substrates, e.g. architectural glass, a rotary sputter target may need to be sufficiently long so as to encompass one full dimension, e.g. width, of the substrate during sputter (see e.g. FIG. 7). In certain embodiments, a lithium rotary target (and/or the backing tube) is between about 100 mm and about 2500 mm long, in another embodiment between about 1000 mm and about 2500 mm long, in yet another embodiment between about 1500 mm and about 2000 mm long. In one embodiment, the lithium portion of the rotary target is between about 1 mm and about 100 mm thick (deep), that is, the portion of lithium in the direction of erosion by the sputter gas or plasma.

One of ordinary skill in the art would appreciate that various combinations of the above embodiments are contemplated in this description. For example, improved adhesion is achieved through texturing the back plate and/or applying an adhesion layer and/or roll pressing and/or thermal reworking as described. In another example, lithium is pressed (vertical or roller) or cast into a recessed backing plate as described herein, where at least the recessed portion of the backing plate has a textured surface and/or an adhesion coating. Additionally, the backing plate may be heated to improve adhesion and/or improve morphology of the lithium for sputter deposition uniformity improvement. Additionally, passivation coatings may be removed from the top (and/or side) surface of the lithium as described herein. Lithium tiles or rotary targets may have any of the above described adhesion enhancing embodiments, removable coatings, heat exchanger features, and the like as described herein.

Although the foregoing invention has been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. A lithium sputter target comprising:
   i) a backing support having a planar topography; and
   ii) a layer of lithium metal adhered to the planar topography of the backing support; and
   iii) an external non-planar lithium target surface of the lithium metal layer,
   wherein the external non-planar lithium target surface varies in planarity in its central region, having contours that vary in height between about 1 mm and about 20 mm, and
   wherein the central region of the external non-planar lithium target surface is a sputter surface.

2. The lithium sputter target of claim 1, wherein the backing support is a backing plate or a backing tube.

3. The lithium sputter target of claim 2, wherein the backing support comprises copper.

4. The lithium sputter target of claim 3, wherein the backing support comprises an adhesion layer.

5. The lithium sputter target of claim 4, wherein the adhesion layer comprises at least one of nickel and molybdenum.

6. A lithium sputter target comprising:
   i) a backing support having one or more textured features comprising a heat exchanger having a network of coolant conduits outside the outer surface of the backing support; and
   ii) lithium cast or sprayed onto the one or more textured features, wherein the lithium covers at least a portion of the network of coolant conduits forming a target surface.

7. The lithium sputter target of claim 6, wherein the backing support is a backing plate or a backing tube and wherein the one or more textured features further comprises at least one of knurling, and ground or milled features.

8. The lithium sputter target of claim 6, wherein the backing support is a backing plate or a backing tube, and wherein the one or more textured features further comprises a bolt, a stud, a pin or a rod, each optionally comprising knurling, threads or an uneven surface topography.

9. The lithium sputter target of claim 6, wherein the network of coolant conduits comprises copper.

10. The lithium sputter target of claim 8, wherein the bolt, the stud, the pin, or the rod comprises copper.

11. The lithium sputter target of claim 8, wherein the one or more textured features comprises an adhesion layer.

12. The lithium sputter target of claim 11, wherein the adhesion layer comprises at least one of nickel and molybdenum.

13. A sputter target backing plate comprising:
    i) a unitary body comprising copper; and
    ii) a recess in the unitary body;
    wherein the recess comprises perimeter sidewalls and an opening between the perimeter sidewalls, and wherein the top of the perimeter sidewalls have a surface area that is between 1% and 10% of the surface area of the opening of the recess.

14. The sputter target backing plate of claim 13, wherein perimeter sidewalls have an outer surface that is substantially planar and vertical or angled, or curved and convex or concave.

15. A rotary sputter target comprising:
    i) a backing tube;
    ii) a heat exchanger outside the outer surface of the backing tube, the heat exchanger comprising a network of coolant conduits; and
    iii) a target metal with a melting point below 450 degrees Celsius, wherein the target metal is applied to the outer surface of the backing tube such that the target metal covers at least a portion of the network of coolant conduits and the target metal forms a target surface that approximates the shape of the outer surface of the backing tube.

16. The rotary sputter target of claim 15, wherein the network of cooling conduits extend between about 1 mm and about 20 mm from the surface of the backing tube and wherein the rotary sputter target is between 1000 mm and about 2500 mm long.

* * * * *